US011094726B2

(12) United States Patent
Simony

(10) Patent No.: US 11,094,726 B2
(45) Date of Patent: Aug. 17, 2021

(54) PIXEL AND METHOD OF CONTROLLING THE SAME

(71) Applicant: STMicroelectronics (Grenoble 2) SAS, Grenoble (FR)

(72) Inventor: Laurent Simony, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/829,837

(22) Filed: Mar. 25, 2020

(65) Prior Publication Data

US 2020/0312896 A1    Oct. 1, 2020

(30) Foreign Application Priority Data

Mar. 29, 2019    (FR) ...................................... 1903420

(51) Int. Cl.
*H01L 27/146*    (2006.01)
*H04N 5/369*    (2011.01)

(52) U.S. Cl.
CPC ..... *H01L 27/14612* (2013.01); *H04N 5/3696* (2013.01)

(58) Field of Classification Search
CPC ......... H01L 27/14612; H01L 27/14609; H01L 27/14601; H01L 27/146; H04N 5/3696; H04N 5/369; H04N 5/374; H04N 5/3745; H04N 5/376; H04N 5/378

See application file for complete search history.

(56) References Cited

U.S. PATENT DOCUMENTS

| 6,727,946 | B1 | 4/2004 | Zhao et al. |
| 6,919,551 | B2 | 7/2005 | Bama et al. |
| 10,200,644 | B2 | 2/2019 | Do et al. |
| 2001/0033337 | A1 | 10/2001 | Sakuragi |
| 2004/0207740 | A1 | 10/2004 | Rossi |
| 2004/0263656 | A1* | 12/2004 | Simony .................. H04N 5/378 348/308 |
| 2005/0270394 | A1 | 12/2005 | Dierickx et al. |

(Continued)

FOREIGN PATENT DOCUMENTS

| EP | 2109306 A2 | 10/2009 |
| WO | 2011155442 A1 | 12/2011 |

OTHER PUBLICATIONS

INPI Search Report and Written Opinion for FR 1903420 dated Oct. 17, 2019 (8 pages).

*Primary Examiner* — John R Lee
(74) *Attorney, Agent, or Firm* — Crowe & Dunlevy

(57) ABSTRACT

A global shutter pixel includes a first transistor and a first switch series-connected between a first node of application of a potential and an internal node of the pixel. A control terminal of the first transistor is coupled to a floating diffusion node of the pixel. At least two assemblies are coupled to the internal node, where each assembly is formed of a capacitor series-connected with a second switch coupling the capacitor to the internal node. A second transistor has a control terminal connected to the internal node and a first conduction terminal coupled to an output node of the pixel. The pixel operation is controlled to store an initialization voltage from the floating diffusion on one of the capacitors and a pixel integration voltage from the floating diffusion on another of the capacitors.

25 Claims, 5 Drawing Sheets

(56) References Cited

U.S. PATENT DOCUMENTS

| | | | |
|---|---|---|---|
| 2008/0122962 A1* | 5/2008 | Shah | H04N 5/357 348/308 |
| 2011/0242381 A1* | 10/2011 | Sakakibara | H04N 5/335 348/301 |
| 2013/0161494 A1* | 6/2013 | Sohn | G01J 1/46 250/214 P |
| 2014/0239161 A1* | 8/2014 | Meynants | H04N 5/363 250/214 SW |
| 2016/0088251 A1 | 3/2016 | Luo et al. | |
| 2018/0234652 A1* | 8/2018 | Sugawa | H04N 5/3559 |
| 2018/0332247 A1 | 11/2018 | Do et al. | |
| 2020/0312896 A1* | 10/2020 | Simony | H01L 27/14612 |
| 2020/0382731 A1* | 12/2020 | Simony | H04N 5/341 |

\* cited by examiner

PIXEL AND METHOD OF CONTROLLING THE SAME

PRIORITY CLAIM

This application claims the priority benefit of French Application for Patent No. 1903420, filed on Mar. 29, 2019, the content of which is hereby incorporated by reference in its entirety to the maximum extent allowable by law.

TECHNICAL FIELD

The present disclosure generally concerns pixels of image sensors of global shutter type, and more particularly voltage domain pixels. A pixel is called a voltage domain pixel when, in the context of the general acquisition of an image by a sensor comprising such pixels, the pixel information is generated in the form of voltages stored in capacitors. Conversely, a pixel is called a charge domain pixel when, in the context of the general acquisition of an image by a sensor comprising such pixels, the pixel information is stored in the form of charges in diodes.

BACKGROUND

A global shutter sensor comprises a plurality of pixels, generally arranged in an array comprising a plurality of rows and a plurality of columns of pixels. In such a sensor, the integration phase is common to all the sensor pixels or, in other words, simultaneous for all the sensor pixels. The integration phase of a pixel starts by initializing a photosensitive area of the pixel and ends when a voltage representative of the charges stored in the photosensitive area is stored in the pixel. The voltages stored in the sensor pixels are then sequentially read, generally by simultaneously reading from all the pixels of a same sensor row, the rows being sequentially read one after the other.

There is a need for a pixel for a global shutter image sensor, also called global shutter pixel, and for a control method overcoming all or part of the disadvantages of known global shutter pixels and control methods.

SUMMARY

An embodiment overcomes all or part of the disadvantages of known global shutter pixels and all or part of the disadvantages of known global shutter pixel control methods.

An embodiment provides a global shutter pixel and its control method which enable to implement a correlated double sampling (CDS).

An embodiment provides a global shutter pixel and its control method which are compatible with existing pixel readout circuits, in particular readout circuits comprising a single input terminal coupled to a pixel column of a pixel array of a sensor, particularly, a four transistor pixel or 4T pixel readout circuit.

Thus, an embodiment provides a global shutter pixel comprising: a first transistor and a first switch series-connected between a first node of application of a potential and an internal node of the pixel, a control terminal of the first transistor being coupled to a floating diffusion node of the pixel; a plurality of assemblies, each formed of a capacitor series-connected with a second switch coupling the capacitor to the internal node; and a second transistor having a control terminal connected to the internal node and having a first conduction terminal coupled to an output node of the pixel.

According to an embodiment, the source of the first transistor is not coupled to a source of a constant or substantially constant bias current.

According to an embodiment, the first switch couples the first transistor to the internal node.

According to an embodiment, the first switch couples the first transistor to the first node.

According to an embodiment, the pixel further comprises a photoconversion area, preferably a photodiode, preferably pinned, and a transfer gate connected between the floating diffusion node and said photoconversion area.

According to an embodiment, the pixel further comprises: a third transistor connected between the floating diffusion node and a second node of application of a potential; a third node of application of a potential, a second conduction terminal of the second transistor being coupled to the third node; and a power supply circuit configured to apply a first power supply potential level to the second node during at least a first operating phase of the pixel and to apply a second power supply potential level to the third node during at least a second operating phase, preferably via a same conductive rail.

An embodiment provides an image sensor comprising a plurality of pixels such as defined hereabove, and a control circuit for controlling said pixels, the control circuit being configured to apply a potential to the first node of application and to control the first switch and the second switches.

According to an embodiment, the control circuit is configured to switch the potential applied to the first node, from a first level, preferably relatively lower, to a second level, preferably relatively higher, while controlling a slope of said potential.

An embodiment provides a method of controlling a global shutter pixel comprising the successive steps of: a) controlling the turning on of a first switch series-connected with a first transistor between a first node of application of a potential and an internal node of the pixel, a control terminal of the first transistor begin coupled to a floating diffusion node of the pixel; and b) in a given assembly of a plurality of assemblies, each assembly formed of a capacitor in series with a second switch coupling the capacitor to the internal node, storing a voltage representative of a state of the floating diffusion node, during steps comprising: b1) controlling the turning on of the second switch of the given assembly while maintaining turned off the second switch of each other assembly of said plurality of assemblies; and b2) controlling the turning off of the second switch of the given assembly to store said voltage across the capacitor of said assembly.

According to an embodiment, step b) is successively repeated for each of said plurality of assemblies.

According to an embodiment, the source of the first transistor is not coupled to a source of a constant or substantially constant bias current.

According to an embodiment, step b) storing further comprises, between steps b1) and b2), a step b3) controlling a switching from a first level, preferably relatively lower, to a second level, preferably relatively higher, of a control potential applied to said first node, preferably while controlling the slope of the control potential during said switching.

According to an embodiment, each time step b) is repeated, a same time period separates step b3) from step b2).

According to an embodiment, the method further comprises, prior to step b), a step c) initializing the voltages across the capacitors of said plurality of assemblies, step c) comprising applying the control potential at the first level while maintaining the first switch and the second switches turned on.

According to an embodiment, the method further comprises, for each of said plurality of assemblies, a step d) reading the voltage stored across the capacitor of said assembly, wherein step d) comprises turning on the second switch of said assembly while maintaining the first switch and the second switches of the other said plurality of assemblies turned off.

According to an embodiment, the method further comprises, prior to each step d), a step e) initializing said internal node by applying the control potential at the first level while maintaining the first switch turned on and the second switches turned off.

BRIEF DESCRIPTION OF THE DRAWINGS

The foregoing and other features and advantages of the present invention will be discussed in detail in the following non-limiting description of specific embodiments in connection with the accompanying drawings, wherein.

DETAILED DESCRIPTION

Figure 1:
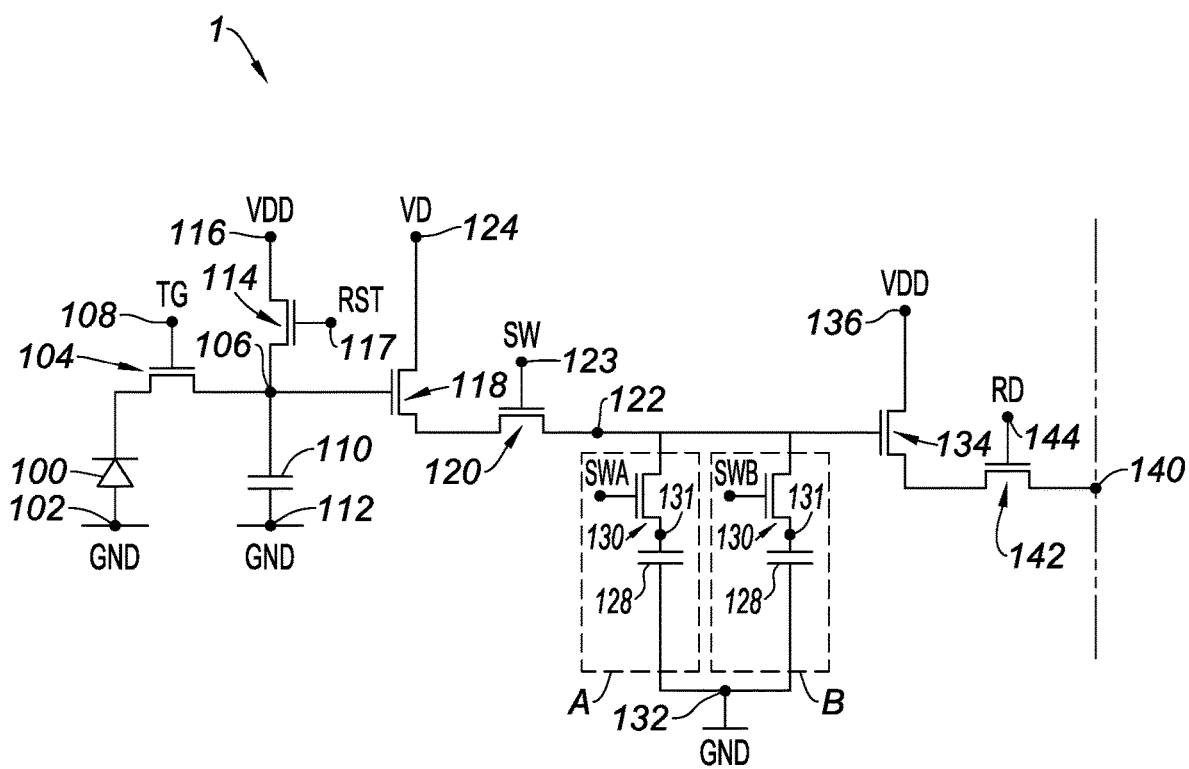
FIG. 1 shows an embodiment of a circuit of a global shutter pixel.

The same elements have been designated with the same reference numerals in the different drawings. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and are detailed. In particular, the electronic devices where a global shutter image sensor may be provided have not been described, the embodiments and implementation modes being compatible with usual electronic devices comprising a global shutter image sensor. Further, the pixel readout circuits have not been detailed, the described embodiments and implementation modes being compatible with usual readout circuits, particularly with 4T pixel readout circuits.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 shows an embodiment of a circuit of a global shutter pixel 1.

Pixel 1 comprises a photosensitive area 100, also called photoconversion area 100, configured to store charges photogenerated from the light that it receives, for example, to store electrons of photogenerated electron-hole pairs.

In this example, photosensitive area 100 is a photodiode having its anode coupled, preferably connected, to a node 102 of application of a reference potential such as ground GND. Preferably, the photodiode is a so-called pinned photodiode.

A device 104 for transferring the photogenerated charges stored in area 100 to a floating diffusion node 106 is connected between area 100 and node 106. In FIG. 1, device 104 is a MOS transistor having its two conduction terminals (source and drain) coupled, preferably connected, respectively to area 100 and to node 106 and having its control terminal (gate) connected to a node 108 of application of a control potential TG. More particularly, in the shown example where area 100 is a pinned photodiode having its anode coupled to ground GND, transistor 104 has an N channel and is connected between the cathode of photodiode 100 and node 106. Preferably, transistor 104 forms a transfer gate between photodiode 100 and node 106, that is, a MOS transistor having its terminal on the side of photodiode 100 formed by the cathode of photodiode 100.

A capacitor 110 is present between node 106 and a node 112 of application of the reference potential, here ground GND.

Node 106 is coupled to a node 116 of application of a potential, in the present example a positive potential VDD for supplying pixel 1, by a switch 114. Switch 114 is controlled by a control potential RST. Switch 114 is, for example, a MOS transistor, in the present example with an N channel, having its conduction terminals coupled, preferably connected, to respective nodes 106 and 116, and having its control terminal coupled, preferably connected, to a node 117 of application of potential RST.

Node 106 is further connected to the control terminal of a transistor 118. In the present example, transistor 118 is an N-channel MOS transistor.

Transistor 118 is series-connected with a switch 120, between an internal node 122 of pixel 1 and a node 124 of application of a potential VD. Switch 120 is controlled by a control potential SW. Switch 120 is, for example, a MOS transistor, in the present example, with an N channel, having its gate connected to a node 123 of application of potential SW.

In this embodiment, switch 120 is connected between node 122 and a conduction terminal of transistor 118, the source of transistor 118 in the present example. More particularly, in the present example, the conduction terminals of transistor 120 are respectively connected to node 122 and to the source of transistor 118.

Further, in the present embodiment, node 124 is a node of application of control potential VD. Transistor 118 is then assembled as a non-biased source follower. In other words, the source of transistor 118 is connected or coupled to no source of a constant or substantially constant bias current. In practice, signal or potential VD is supplied by a power source, preferably common to all the pixels of a sensor, for example, a voltage regulator.

Pixel 1 further comprises two assemblies A and B (in dotted lines in FIG. 1), each formed of a capacitor 128 in series with a switch 130. Assemblies A and B are connected to node 122. Switch 130 of assembly A is controlled by a control potential SWA and switch 130 of assembly B is controlled by a control potential SWB.

More particularly, in each of assemblies A and B, switch 130 couples capacitor 128 to node 122. In other words, switch 130 is connected between node 122 and a node 131 of connection of switch 130 to capacitor 128, capacitor 128 being then connected between node 131 and a node 132 of application of a potential, here ground GND. Each of assemblies A and B is thus connected between nodes 132 and 122.

Each switch 130 is, for example, a MOS transistor, in this example with an N channel, having its drain connected to node 122, having its source connected to a first electrode of the corresponding capacitor 128, and having its gate receiving the corresponding potential SWA or SWB.

Preferably, the capacitors 128 of assemblies A and B are implemented using a capacitive deep trench insulation (CDTI) technology. As an example, a CDTI capacitor corresponds to a trench penetrating into a semiconductor region, the trench being filled with a conductive material insulated from the semiconductor region by an insulating layer covering the walls and the bottom of the trench. The conductive material forms a first electrode of the capacitor, in the present example coupled to node 132, and the semiconductor region corresponds to a second electrode of the capacitor. In the case where capacitors 128 are CDTI capacitors, the potential of node 132 is preferably negative.

As an example, capacitors 128 have a capacitance value at least 5 times greater, preferably at least 10 times greater, than that of capacitor 110.

In the present embodiment, assemblies A and B are identical. In other words, capacitors 128 have the same capacitance value and switches 130 have the same electric behavior. However, in practice, manufacturing dispersions may result in that assemblies A and B are not strictly identical.

Node 122 is further connected to the gate of a MOS transistor 134, in the present example with an N channel. A conduction terminal of transistor 134, in the present example, the drain, is coupled to a node 136 of application of power supply potential VDD, the other conduction terminal of transistor 134, in the present example, the source, being coupled to an output node 140 of the pixel, and more exactly to a node 140, or conductive rail, common to all the pixels of a same column of a pixel array of an image sensor.

In the present embodiment, a switch 142 couples a conduction terminal, here the source, of transistor 134 to node 140. Switch 142 is controlled by a control potential RD. The switch is, for example, a MOS transistor, in the present example with an N channel, having its conduction terminals coupled, preferably connected, respectively to node 140 and to the source of transistor 134, and having its gate connected to a node 144 of application of potential RD.

As a variation, switch 142 is connected between transistor 134 and node 136.

Although this is not illustrated, an image sensor comprising an array of pixels 1, arranged in rows and in columns, comprises at least one control circuit configured to supply the pixel control signals, or potentials RST, TG, SWA, SWB, VD, SW, and RD. Such a sensor further comprises one or a plurality of pixel readout circuits, for example, a column readout circuit, the circuit being then coupled, preferably connected, to common rail or node 140 of the column pixels.

The operation of pixel 1 of FIG. 1 will now be described in relation with FIG. 2.

Figure 2:
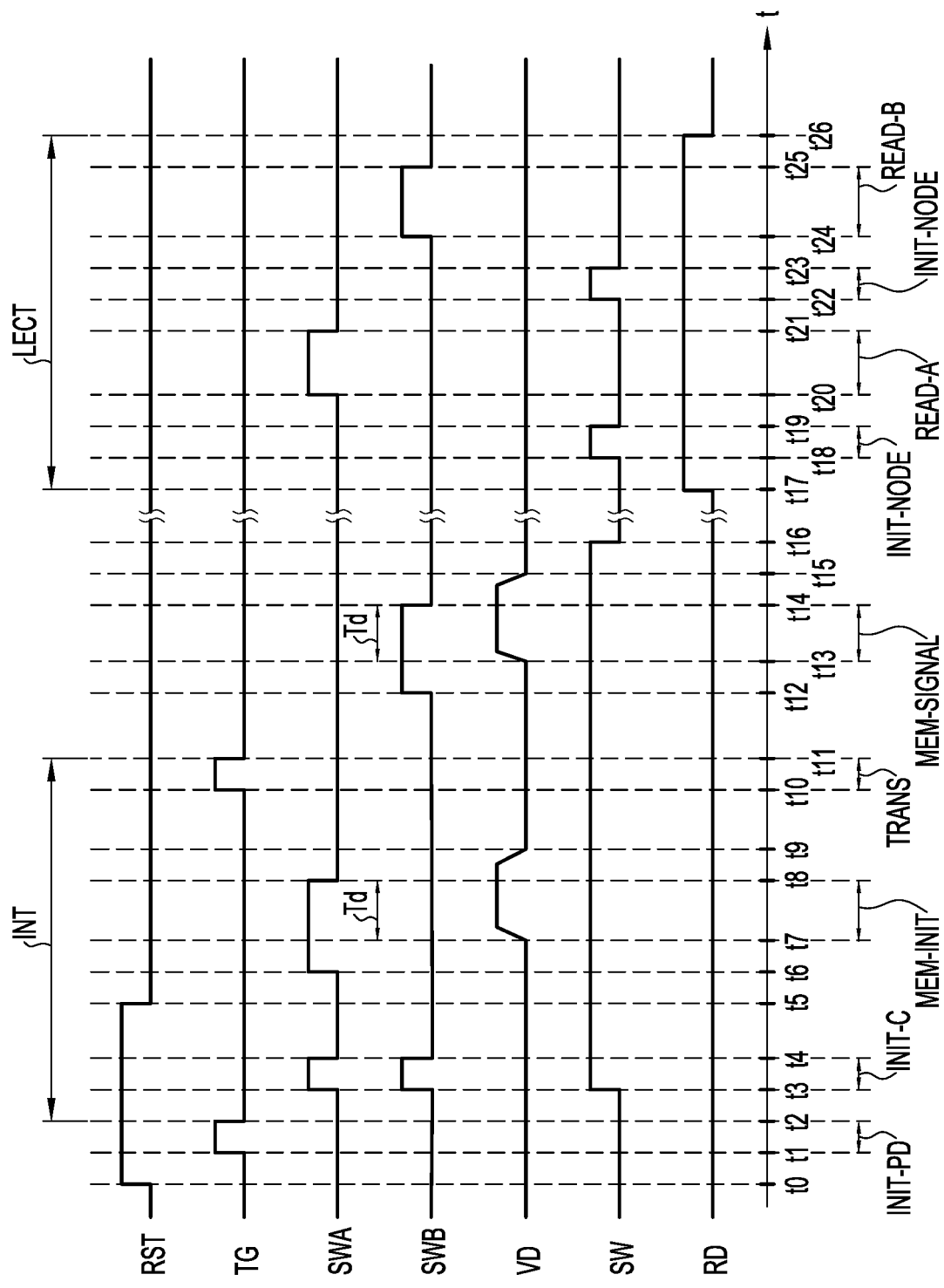
FIG. 2 shows timing diagrams illustrating an implementation mode of a method of controlling the pixel of FIG. 1.

FIG. 2 shows timing diagrams illustrating an implementation mode of a method of controlling pixel 1 of FIG. 1. More particularly, FIG. 2 shows timing diagrams of signals RST, TG, SWA, SWB, VD, SW, and RD for controlling pixel 1.

Signals RST, TG, SWA, SWB, VD, SW, and RD are controlled between lower levels and, relatively, high levels and it is here considered, as an example, that the signals are by default at their low levels, the transistor or transfer gate 104 then preventing the passing of charges from area 100 to node 106, and switches 114, 120, 130, and 142 being turned off. It should be noted that the potential corresponding to the low level of one of signals RST, TG, SWA, SWB, VD, SW, and RD may be different from the potential corresponding to the low level of another one of the signals, and/or that the potential corresponding to the high level of one of the signals may be different from the potential corresponding to the high level of another one of the signals.

Further, in the description made hereafter of FIG. 2, a signal switched from a first level to a second level is maintained at the second level as long as it is not indicated that the signal is switched from the second level to the first level.

Further, in the description made hereafter of FIG. 2, when reference is made to the voltage of a node, it is considered, unless otherwise indicated, that it is the voltage between the node and the ground.

At a time t0, switch 114 is switched from the turned off state to the turned on state by control of the switching of potential RST from its low level to its high level. As a result, voltage VDD at node 116 is present at node 106.

At a next time t1, transistor 104 is turned on by control of the switching of signal TG from its low level to its high level. In other words, the passage of photogenerated charges from area 100 to node 106 is authorized, via transistor 104. This corresponds to a step (INIT-PD) of initialization of area 100, that is, area 100 is emptied of the photogenerated charges, here electrons, which may be present therein, the charges being then discharged to node 106.

At a next time t2, transistor 104 is turned off by control of the switching of signal TG from its high level to its low level. This insulates area 100 from node 106, preventing photogenerated charges from passing from area 100 to node 106. The switching from the turned on to the turned off state of transistor 104 marks the end of the step of initialization of area 100 and the beginning of a period of integration (INT) of pixel 1 during which charges are photogenerated and stored in area 100.

At a next time t3, the voltages across capacitors 128 are initialized (INIT-C). For this purpose, while signal or potential VD is at its low level, switches 120 and 130 are turned on by control of the switching of signals SWA, SWB, and SW from their low levels to their high levels. In practice, such switching operations are not necessarily simultaneous, conversely to what is shown in FIG. 2. Due to the fact that signal VD is maintained at its low level, that transistor 118 receives potential VDD on its gate, and that switches 120 and 130 are turned on, the low level of signal VD is present, for each capacitor 128, on the corresponding node 131, and thus sets an initialization voltage for capacitors 128.

At a next time t4, marking the end of the initialization of the voltages across capacitors 128, switches 130 are turned off by control of the switching of signals SWA and SWB from their high levels to their low levels. As a result, capacitors 130 are then electrically insulated from node 122, the voltage across each capacitor 128 being then equal to the above-mentioned initialization voltage.

At a next time t5, switch 114 is turned off by control of the switch of signal RST from its high level to its low level. Node 106 is then insulated from node 116. The potential present at node 106 after the turning off of switch 114 is called initialization level, or reset level.

A voltage representative of the initialization level is then stored (MEM-INIT) across the capacitor 128 of one of assemblies A and B, in the present example, assembly A.

For this purpose, at a next time t6, switch 130 of assembly A is turned off by control of the switching of signal SWA from its low level to its high level.

Then, at a next time t7, while switch 120 is maintained turned on (SW at its high level) and switch 130 of assembly B is maintained turned off (signal SWB at its low level), voltage VD is switched from its low level to its high level or, in other words, signal VD is switched to its high level.

At a next time t8, switch 130 of assembly A is turned off by control of the switching of signal SWA from its high level to its low level. This causes the storage, by capacitor 128 of assembly A, of the voltage present across the capacitor upon turning on of switch 130 of assembly A. Between times t7 and t8, transistor 118 is first in an ohmic state and the voltage across capacitor 128 of assembly A increases with potential VD. Then, transistor 118 enters a saturation state and the voltage across capacitor 128 of assembly A then has a value mainly depending on the potential at node 106, here the initialization level. Indeed, when transistor 118 is in a saturated state, the voltage across capacitor 128 keeps on increasing, with a decreasing slope. As a result, the voltage across capacitor 128 depends not only on the potential of node 106, but also on a time period separating the control of the switching of switch VD to its high level (time t7) from the control SWA of the turning off of switch 130 (time t8). It is thus here provided for a determined time period Td to separate the control of the switching of signal VD to its high level (time t7) from the control SWA of the turning off of switch 130 (time t8).

Preferably, to control, and more particularly to limit, the current flowing through transistor 118 during the switching of signal VD from the low level to the high level, the slope with which the switching occurs is controlled, so that the slope of signal VD does not exceed a given value. Indeed, in a sensor comprising a large number of pixels of the type of that in FIG. 1, for example, several millions of pixels, the signal or potential VD is simultaneously delivered to all the sensor pixels by a same power source, for example, by a voltage regulator. The control of the slope of signal VD enables to limit a current drawn by these many pixels on modification of the level of signal VD, to ensure the proper operation of the regulator. As an example, the control of the slope of signal VD delivered by the regulator is ensured by providing a set point signal, for example, a voltage, to the controlled slope regulator.

At a next time t9, signal VD is switched from its high level to its low level.

At a next time t10, transistor 104 is switched to the turned on state by control of the switching of signal TG from its low level to its high level. At a next time t11, transistor 104 is turned off by control of the switching of signal TG from its high level to its low level. Thus, between times t10 and t11, the charges photogenerated and stored, here the electrons, in area 100 from time t2 to time t11, are transferred to node 106 (step TRANS) due to the fact that signal TG is at its high level and that the electric potential of node 106 is higher than that of the cathode of photodiode 100. The potential of node 106 then decreases by a value determined by the number of transferred charges. The potential of node 106 after the switching of transistor 104 from the turned on state to the turned off state, called signal level, is thus representative of the number of charges photogenerated and stored in area 100 between times t2 and t11, and thus of the quantity of light received by area 100 between times t2 and t11. Time t11 marks the end of integration period INT.

A voltage representative of the signal level is then stored (MEM-SIGNAL) across the capacitor 128 of assembly A or B, in this example assembly B, which has not been used yet to store a potential level of node 106.

To achieve this, at a next time t12, switch 130 of assembly B is turned on by control of the switching of signal SWB from its low level to its high level.

Then, at a next time t13, while switch 120 is maintained turned on (SW at its high level) and switch 130 of assembly A is maintained turned off (signal SWA at its low level), voltage VD is switched from its low level to its high level or, in other words, signal VD is switched to its high level.

At a next time t14, switch 130 of assembly B is turned off by control of the switching of signal SWB from its high level to its low level. This causes the storage, by capacitor 128 of assembly B, of the voltage present across the capacitor at the turning on of switch 130 of assembly B. Between times t13 and t14, transistor 118 is first in an ohmic state and the voltage across capacitor 128 of assembly B increases with potential VD. Then, transistor 118 enters a saturated state and the voltage across capacitor 128 of assembly B then has a value mainly depending on the potential at node 106, here the signal level. Due to the fact that the voltage across capacitor 128 does not settle and keeps on increasing, even slightly, it is here provided, as for assembly A, for control SWB of the turning off of switch 130 (time t14) to be separated from the control of the switching of signal VD to its high level (time t13) by time period Td. The time period Td for assembly B is identical to the time period Td for assembly A. More particularly, the control sequence between times t6 to t9 is identical, as concerns its time sequence, to the control sequence between times t12 to t15.

Preferably, as during the storage of a voltage across capacitor 128 of assembly A, it is provided to control the slope of signal VD at the storage of a voltage across capacitor 128 of assembly B. Preferably, the control of the slope of signal VD is identical for assembly A and assembly B.

At a next time t15, signal or potential VD is switched from its high level to its low level.

In the present example, at a next time t16, switch 120 is turned off by control of the switching of signal SW from its high level to its low level. This enables to isolate node 122 from transistor 118, and thus from node 124. This enables to avoid any modification, by transistor 118, of the voltages stored across capacitors 128.

When pixel 1 forms part of an image sensor comprising a pixel array 1 organized in rows and in columns, time t16 marks, in the present example, the end of a general phase of acquisition and of storage of an image by the sensor. Such a general phase is implemented simultaneously for all the sensor pixels. The sensor pixels may then be read, the reading from the pixels being simultaneous for all the pixels of a same row, and the pixel rows being read from one by one, sequentially.

A next time t17 marks the beginning of a phase of reading (LECT) from pixel 1, that is, in the case of a sensor comprising a pixel array 1, of a phase of simultaneous reading from all the pixels 1 of a given row selected by signal RD, the pixels then receiving the same signals RST, TG, SWA, SWB, VD, SW, and RD.

At time t17, switch 142 is turned on by control of the switching of signal RD from its low level to its high level. Switch 142 is maintained turned on for the entire time period of the phase of reading from pixel 1. Thus, transistor 134 has a conduction terminal, here, its drain, connected to node 136, and its other conduction terminal, here, its source, electrically coupled to node 140. As a result, a bias current is then supplied to the source of transistor 134 by the readout circuit connected to node 140. Transistor 134 then operates as a biased source follower.

The voltages stored by assemblies A and B may be read in any order. It is here considered as an example that the voltage representative of the initialization level, that is, here, the voltage stored by assembly A, is read first (READ-A), the voltage representative of the signal level, that is, here, the voltage stored by assembly B, being then read (READ-B).

Further, before each reading of a voltage stored across the capacitor of any of assemblies A and B, the potential at node 122 is placed at a determined value (INIT-NODE), by turning on and then turning back off switch 120 while signal VD is maintained at its low level.

Thus, in the present example, at a time t18 subsequent to time t17, switch 120 is turned on by control of the switching of signal SW from its low level to its high level.

At a next time t19, switch 120 is turned off by control of the switching of signal SW from its high level to its low level.

At a next time t20, switch 130 of assembly A is turned on by control of the switching of signal SWA from its low level to its high level. Due to the fact that switch 130 of assembly A is turned on and switch 130 of assembly B is turned off, the voltage across capacitor 128 of assembly A balances with the voltage present at node 122 at the end of initialization step INIT-NODE of node 122. The value of the stray capacitance of node 122 is very low as compared with that of capacitor 128, this value being ideally zero. As an example, the value of capacitor 128 is ten times greater, or even twenty times greater than that of the stray capacitance of node 122. As a result, the voltage which is present at node 122 is then substantially equal to the voltage which was stored across capacitor 128 of the assembly. The voltage at node 122 imposes, via transistor 134, a first voltage at node 140. The first voltage is stored by the readout circuit and is representative of the voltage which was stored across capacitor 128 of assembly A, and thus of the initialization level.

At a next time t21, switch 130 of assembly A is turned off by control of the switching of signal SWA from its high level to its low level.

Between successive times t22 and t23, subsequent to time t21, node 122 is placed at a determined level (INIT-NODE), in the same way as described in relation with respective times t18 and t19.

At a next time t24, switch 130 of assembly B is turned on by control of the switching of signal SWB from its low level to its high level. Due to the fact that switch 130 of assembly B is turned on and switch 130 of assembly A is turned off, the voltage across capacitor 128 of assembly B balances with the voltage present at node 122 at the end of initialization step INIT-NODE. The voltage which is present at node 122 is then substantially equal to the voltage which was stored across capacitor 128 of assembly B. The voltage at node 122 then imposes, via transistor 134, a second voltage at node 140. The second voltage is stored by the readout circuit and is representative of the voltage which was stored across capacitor 128 of assembly B, and thus of the signal level.

At a next time t25, switch 130 of assembly B is turned off by control of the switching of signal SWB from its high level to its low level.

At a next time t26, switch 142 is turned off by control of the switching of signal RD from its high level to its low level. The turning off of switch 142 marks the end of the pixel readout phase, and thus the end of the phase of reading from the corresponding pixel row. Another row of sensor pixels can then be read, by repeating the steps described in relation with Figures t17 to t26 for the pixels of this other row. Once all the sensor rows have been read from, a new general phase of acquisition and of storage of an image such as described in relation with times t1 to t16 may be implemented in the sensor.

More generally, in an image sensor comprising an array of pixels 1 arranged in rows and in columns, steps INIT-PD, INIT-C, MEM-INIT, TRANS, and MEM-SIGNAL are preferably implemented simultaneously for all the pixels of the array and correspond to a general phase of acquisition and of storage of an image. Steps INIT-NODE, READ-A, and READ-B are implemented simultaneously for all the pixels of a row selected by switching of its signal RD to the high level, the rows being selected one after the others. A sensor comprising an array of pixels 1 and a control circuit configured to supply the control signals of the pixels to implement the above method is here provided.

In pixel 1, the storage, across capacitors 128, of a voltage representative of the initialization level and of a voltage representative of the signal level, and then the reading and the storage, by the pixel readout circuit, of a first voltage, representative of the voltage stored across one of capacitors 128, and of a second voltage representative of the voltage stored across the other capacitor 128, corresponds to the implementation of a correlated double sampling. For example, the pixel readout circuit then subtracts the first stored voltage to the second stored voltage, which enables to correct the offset of pixel 1.

In pixel 1, due to the fact that the two assemblies A and B are identically controlled, in particular as concerns the retention time periods during which data are stored across capacitors 128, and that they have an identical electrical behavior, particularly towards leakages in capacitors 128, the difference between the first and second voltages read and stored by the readout circuit is not affected by leakages. This is true as long as there exists no manufacturing dispersions between the two assemblies A and B.

Further, pixel 1 enables, during a storage of a voltage across a capacitor 128, the conductive path seen by transistor 118 all the way to capacitor 128 to be identical, to within manufacturing dispersions, in particular as concerns the capacitance seen by the source of transistor 118, whatever the considered capacitor 128. Pixel 1 enables, on reading of a voltage stored across a capacitor 128, the conductive path seen by transistor 134 all the way to capacitor 128 to be identical, to within manufacturing dispersion, in particular as concerns the capacitance seen by the gate of transistor 134, whatever the considered capacitor 128. This enables to avoid introducing a pixel offset.

An advantage of the above pixel 1 is that it is compatible with existing readout circuits implementing a correlated double sampling. In particular, according to the readout circuit used to read from pixel 1, it may be chosen to adapt the order in which assemblies A and B are read from.

Further, on reading of the voltage stored by a first one of the two assemblies A and B, the capacitances of the second one of assemblies A and B is electrically isolated from node 122 by the corresponding switch 130. The capacitances of the two assemblies are thus not connected in parallel during the readout step. This results in a better dynamic range of pixel 1 with respect to a pixel where, on reading of a first voltage stored in a first storage capacitance, the first capacitance would be connected or coupled in parallel with a second storage capacitor having a second voltage stored therein. Indeed, such a placing in parallel of storage capacitors might result in a difference between two voltage levels successively applied to the gate of a source follower transistor having its source coupled to an output node of the pixel, and which respectively correspond to the first and second stored voltages, significantly smaller than the difference between the first and second stored voltages. In other words, the step of reading from an assembly A or B causes no significant decrease in the signal level, which enables to obtain a better signal-to-noise ratio (SNR) than that of a pixel 1 where the readout step would cause the placing in parallel of two storage capacitors.

Further, due to the fact that assemblies A and B are identical, to within manufacturing dispersions, and that they are read from independently from each other, the correlated double sampling is particularly simple to implement. It should in particular be noted that the storages, as well as the readings, may first be performed in assembly A and then in assembly B, and that the inverse is also possible.

A sensor comprising an array of pixels 1 may be used to capture a video of a scene. In this case, the circuit for controlling sensor pixels 1 is preferably configured to alternate the storage of the voltages respectively representative of the initialization level and of the signal level, in respective assemblies A and B during a given image, and in respective assemblies B and A during the next image. As a result, the possible offset remaining for each pixel, after having subtracted the first voltage read and stored by the circuit for reading from pixel 1 from the second voltage read and stored by the circuit for reading from pixel 1, changes sign but remains the same in absolute value between two successively captured images. Thus, on viewing of the video, due to persistence of vision, this results in an average offset perceived as being null.

Figure 3:
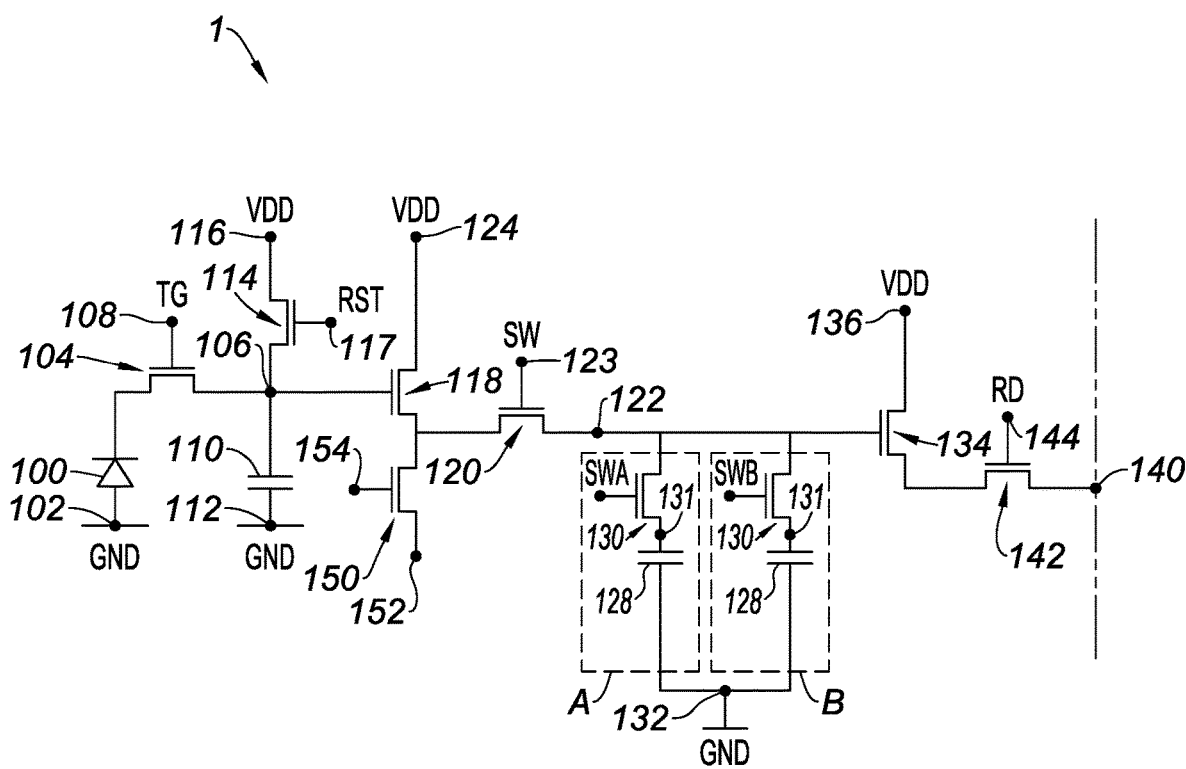
FIG. 3 shows an alternative embodiment of the circuit of the pixel of FIG. 1.

FIG. 3 shows an alternative embodiment of the circuit of pixel 1 of FIG. 1.

Only the differences between the pixel 1 of FIG. 1 and that of FIG. 3 are detailed. More particularly, the pixel 1 of FIG. 3 differs from that of FIG. 1 in that transistor 118 is here assembled as a biased source follower, the potential applied to node 124 is a constant potential, typically power supply potential VDD, and the source of transistor 118 is coupled or connected to a source of a constant bias current, for example, a current source of the sensor.

More particularly, in the present example, the pixel 1 of FIG. 3 comprises a MOS transistor 150 connected between transistor 118 and a node 152 of application of a potential. The gate of transistor 150 is connected to a node 154.

According to an embodiment, a constant bias potential is applied to node 154, the node being common to all the pixels of a pixel array of an image sensor. In this case, node 152 is coupled, preferably connected, to a current source, the current source and node 152 being common to all the pixels of the array.

According to another embodiment, node 152 is a node of application of a bias potential, node 152 being common to all the pixels of a pixel array of an image sensor. The transistor 150 of each pixel 1 of the image sensor is then assembled as a current mirror with a transistor common to all the pixels in the array, connected between a current source and node 152.

The pixel 1 of FIG. 3 benefits from the same advantages as the pixel 1 of FIG. 1, except for those linked to the assembly of FIG. 118 as a non-biased source follower.

Further, the method of controlling the pixel 1 of FIG. 3 differs from that of the pixel 1 of FIG. 1 in that: steps INIT-C and INIT-NODE are omitted; and during steps MEM-INIT and MEM-SIGNAL, the potential of node 124 is constant, whereby the time period during which the potential of node 124 and potential SWA, respectively SWB, are at their high levels has no influence upon the value of the voltage stored in capacitance 128 of assembly A, respectively B, provided for this time period to be sufficient for the potential of node 131 of the considered assembly to settle at its final value.

Figure 4:
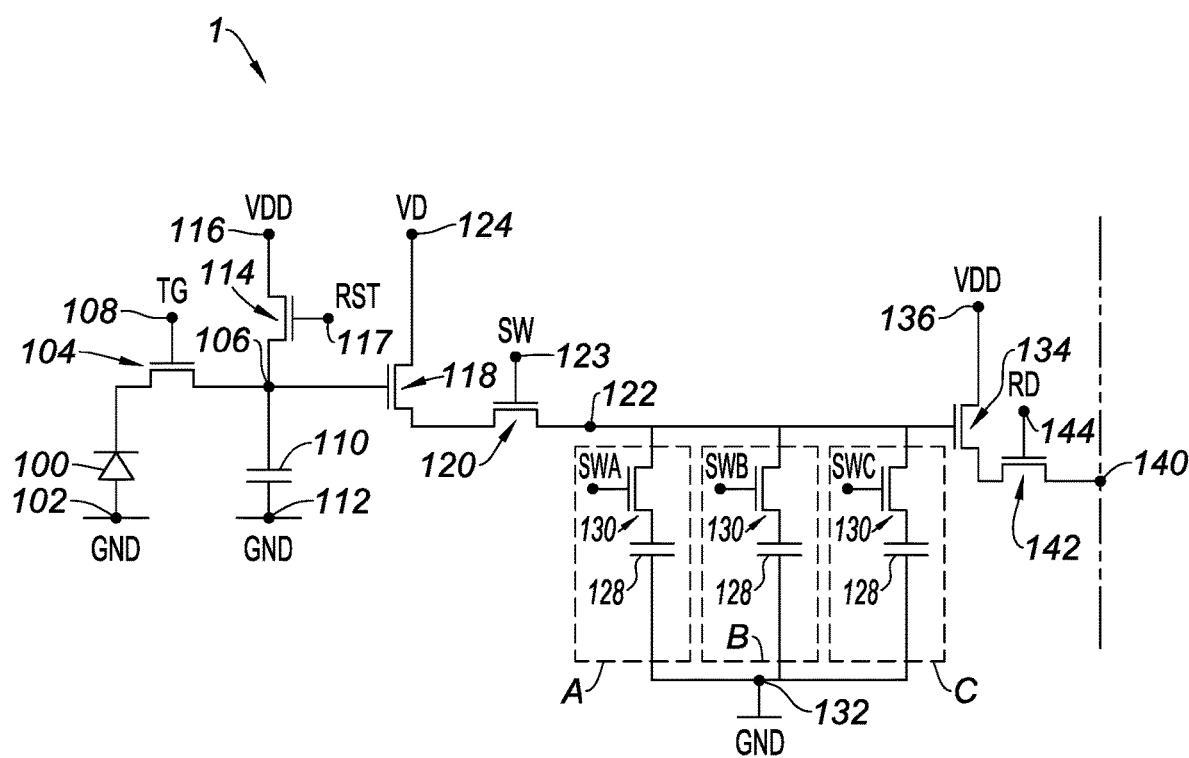
FIG. 4 shows another alternative embodiment of the circuit of the pixel of FIG. 1.

FIG. 4 shows another alternative embodiment of the circuit of pixel 1 of FIG. 1.

In this variation, it is provided for pixel 1 to comprise more than two assemblies A and B of a capacitor 128 in series with a switch 130 coupling capacitor 128 to node 122. More particularly, in the example of FIG. 4, pixel 1 comprises an additional assembly C. Assembly C is connected between nodes 122 and 132, similarly to each of assemblies A and B. The switch 130 of assembly C is controlled by a potential SWC.

Each additional assembly, here, assembly C, enables to store an additional voltage representative of a potential at node 106. This, for example, enables to store a first signal level after a first integration time period, for example, in assembly A as previously described, and an additional signal level corresponding to a longer integration time period. The provision of a plurality of integration time periods for a same general integration step enables to select the signal level according to the light received during the integration phase. For example, the signal level corresponding the longest integration time period when a small quantity of light has been received by area 100 will be selected, which enables to increase the signal-to-noise ratio. Conversely, the signal level corresponding to the shortest integration time period when a large quantity of light has been received by area 100 will be selected, which enables to avoid saturating pixel 1.

It is within the abilities of those skilled in the art to adapt the method described in relation with FIG. 2 for the case of a pixel 1 comprising more than two assemblies A and B, for example, three assemblies A, B, and C.

As an example, as compared with the method described in relation with FIG. 2, in the method of controlling pixel 1 of FIG. 4 which comprises three assemblies A, B, and C, the following is provided: the turning on of all the switches 130 of the pixel during step INIT-C of initialization of capacitors 128; an additional step TRANS of charge transfer from area 100 to node 106, performed after step MEM-SIGNAL; an additional step MEM-SIGNAL2 of storage of a voltage representative of a second signal level of node 106, after the additional transfer step TRANS, to store the voltage across capacitor 128 of assembly C; an additional step INIT-NODE of initialization of node 122 carried out after readout step READ-B; and an additional step READ-C of reading the voltage stored in assembly C, carried out after additional step INIT-NODE.

More particularly, signal SW is then maintained at the high level after the first transfer step TRANS until the additional storage step MEM-SIGNAL2 has been implemented. Similarly, signal RD is maintained at the high level, after step READ-B of reading from assembly B, until step READ-C of reading from assembly C has been implemented. Further, during a step of storage into one of assemblies A, B, and C, or of reading from one of assemblies A, B, and C, only switch 130 of the concerned assembly is turned on, the switches 130 of the other assemblies being maintained turned off.

Although this is not illustrated, more than two assemblies A and B may be provided in pixel 1 of FIG. 3, by adapting the method of controlling this pixel. The adaptation of the method of controlling such a pixel is within the abilities of those skilled in the art based on the functional indications given hereabove.

Further, although this is neither illustrated, nor claimed, a pixel 1 comprising a single assembly A of a capacitor 128 and of a switch 130 may be provided.

Figure 5:
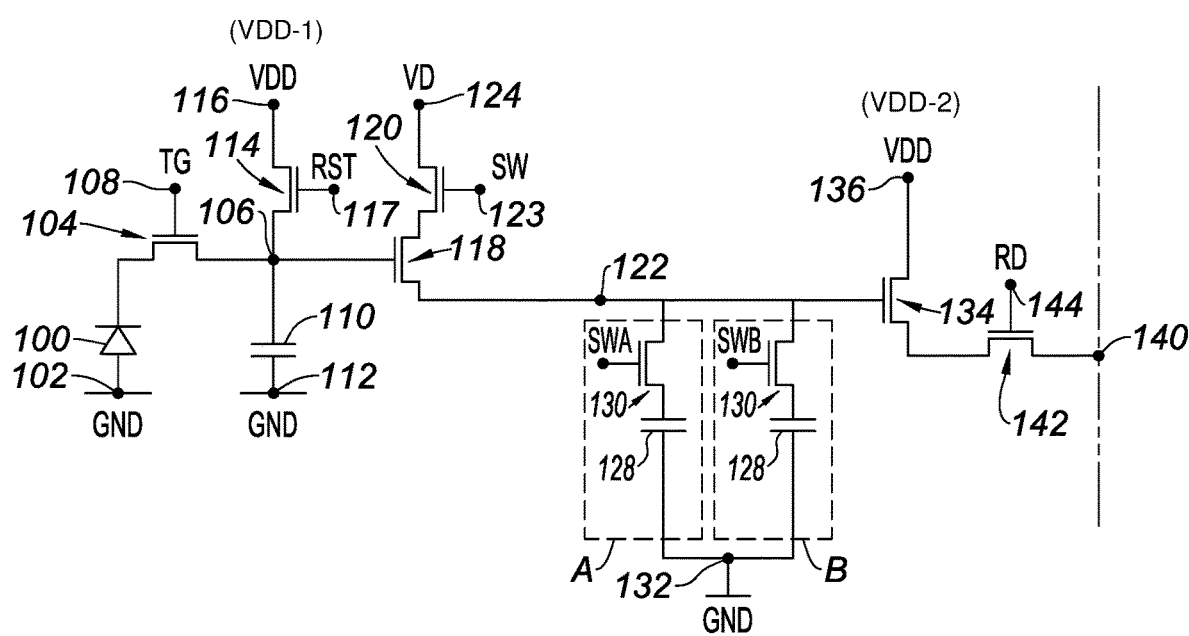
FIG. 5 shows still another alternative embodiment of the circuit of the pixel of FIG. 1.

FIG. 5 shows an alternative embodiment of the circuit of the pixel of FIG. 1.

In this variation, the position of switch 120 is modified with respect to what has been described in relation with FIG. 1. More particularly, in this variation, switch 120 is connected between transistor 118 and node 124. This results in a decrease of the stray capacitance at the level of node 122 with respect to the case of the pixel of FIG. 1.

Such an alternative embodiment, applies to pixels 1 comprising more than two assemblies A and B of a capacitor 128 and of a switch 130, whether transistor 118 is assembled as a biased source follower or as a non-biased source follower.

In the above-described embodiments and variations, nodes 116 and 136 receive a same power supply potential VDD, that is, a same constant potential level is permanently applied to the two nodes 116 and 136. As can be understood from the operation of pixel 1, particularly described in relation with FIG. 2, in the general operating phase (from time t0 to t16 in FIG. 2), transistor 114 is used while transistor 134 is not used and, conversely, in the phase of reading (LECT) from the pixels of a given row (from time t17 to time t26 in FIG. 2), transistor 114 is not used while transistor 134 is used. Thus, in alternative embodiments, (generally indicated by parenthetical identification of VDD-1 and VDD-2), it is provided for a pixel power supply circuit to apply to node 116 a first power supply potential level VDD-1, at least during the general operating phase, and to apply to node 136 a second power supply potential level VDD-2 different from level VDD-1, at least during the pixel readout phase. It is here considered that pixel 1 comprises the power supply circuit in the case where each pixel comprises its own power supply circuit, as in the case where the power supply circuit is common to a plurality of pixels of a sensor, preferably to all the sensor pixels.

Level VDD-1 is preferably optimized so that: transistor 118 is not in linear state or, in other words, remains in saturated state during phases MEM-INIT and MEM-SIGNAL; and/or the potential of node 106 enables, during step TRANS and step INIT-PD, the transfer of substantially all the photogenerated charges from area 100 to node 106, preferably the transfer of all the photogenerated charges from area 100 to node 106; and/or step TRANS causes a variation of potential at node 106 whatever the number of charges photogenerated and stored in area 100 during the previous integration phase INT, provided that the number of charges photogenerated and stored in area 100 during the previous integration phase is between a minimum value and a maximum value defined by the application and technological limits.

Further, level VDD-2 is preferably selected so that transistor 134 remains in saturated state during readout phase LECT. This enables to provide a response of the pixel which is as linear as possible.

Advantage is then taken from the fact that the constraints on the potential level applied to node 116 and the constraints on the potential level applied to node 136, which enable to optimize the operation of pixel 1, belong to different time ranges.

The provision of two levels VDD-1 and VDD-2 may enable to decrease the power consumption of the pixel with respect to the case where a single power supply potential level VDD corresponding to the highest of levels VDD-1 and VDD-2 is permanently applied to nodes 116 and 136.

According to a first implementation, the same power supply potential is delivered to the two nodes 116 and 136, via a single conductive rail comprising nodes 116 and 136. The power supply potential then takes two different levels, that is, the first level VDD-1 during the general operating phase, and the second level VDD-2 during the pixel readout phase.

According to a second embodiment, it is provided for a first conductive rail comprising node 116 to be permanently maintained at potential level VDD-1, and for a second conductive rail comprising node 136 to be permanently maintained at potential level VDD-2.

It should be noted that the first implementation enables to decrease the complexity of the pixel with respect to the case of the second implementation. Indeed, a pixel according to the first implementation requires a decreased number of conductive rails with respect to a pixel according to the second implementation. Thus, as compared with a pixel according to the second implementation, a pixel according to the first implementation may benefit, in the case of a front side illumination (FSI), from a larger optical aperture, or from a smaller total surface area in top view, for a same surface area of area 100. Various embodiments and variations have been described. It will be understood by those skilled in the art that certain features of these various embodiments, implementation modes, and variations may be combined, and other variations will occur to those skilled in the art. In particular, it will be within the abilities of those skilled in the art to adapt the described control methods to the case where a potential different from ground is applied to node 132, the voltage across a capacitor 128, or to node 122, being then referenced with respect to this potential.

Further, it will be within the abilities of those skilled in the art to adapt the described embodiments, implementation modes, and variations to the cases where the charges stored in area 100 and transferred to node 106 are holes rather than electrons, particularly by adapting the power supply potential, the type (N or P channel) of the MOS transistors, and/or the high and low levels of the control signals.

Further, it will be within the abilities of those skilled in the art to adapt the embodiments, implementation modes and variations which have been described to the case where the MOS transistors are replaced with transistors of other technologies and/or to the case where all or part of the switches of pixel 1 are implemented otherwise than with MOS transistors.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A pixel, comprising:
   a variable voltage potential node;
   a floating diffusion node;
   a first transistor and a first switch series-connected between the variable voltage potential node and an internal node of the pixel, a control terminal of the first transistor being coupled to the floating diffusion node;
   a plurality of assemblies, each assembly comprising a capacitor series-connected with a second switch between the internal node and a reference node;
   a second transistor having a control terminal connected to the internal node and having a first conduction terminal coupled to an output node of the pixel; and
   a control circuit configured to apply a first potential level to the variable voltage potential node when actuating the first and second switches to apply an initialization voltage from the floating diffusion node to the capacitors of said plurality of assemblies and to apply a second potential level, different from the first potential level, to the variable voltage potential node when actuating the first and second switches in a first operation to store the initialization voltage from the floating diffusion node in the capacitor of a first assembly of said plurality of assemblies and when actuating the first and second switches in a second operation to store a photodiode integration voltage from the floating diffusion node in the capacitor of a second assembly of said plurality of assemblies.

2. The pixel of claim 1, wherein the first switch couples the first transistor to the internal node.

3. The pixel of claim 1, wherein the first switch couples the first transistor to the first node.

4. The pixel of claim 1, further comprising:
   a photoconversion area formed by a photodiode; and
   a transfer gate connected between the floating diffusion node and said photoconversion area.

5. The pixel of claim 4, wherein the transfer gate is actuated to transfer the photodiode integration voltage to the floating diffusion node.

6. The pixel of claim 1, further comprising:
   a third transistor connected between the floating diffusion node and a supply node;
   wherein the third transistor is actuated to transfer the initialization voltage from said supply node to the floating diffusion node.

7. The pixel of claim 1, wherein a time period between actuating the second switch and deactuating the first switch has a same length during both said first operation and said second operation.

8. The pixel of claim 1, wherein the first potential level is lower than the second potential level.

9. The pixel of claim 1, further comprising means for controlling a slope of change in potential level from the first potential level to the second potential level.

10. The pixel of claim 1, wherein the control circuit is configured to switch from the first potential level to the second potential level while controlling a slope of change in potential at the variable voltage potential node.

11. A pixel, comprising:
    a variable voltage potential node;
    a floating diffusion node;
    a first transistor and a first switch series-connected between the variable voltage potential node and an internal node of the pixel, a control terminal of the first transistor being coupled to the floating diffusion node;
    a first assembly comprising a capacitor series-connected with a second switch between the internal node and a reference node;
    a second transistor having a control terminal connected to the internal node and having a first conduction terminal coupled to an output node of the pixel; and
    a control circuit configured to apply a first potential level to the variable voltage potential node when actuating the first and second switches to apply an initialization voltage from the floating diffusion node to the capacitor of said first assembly and to apply a second potential level, different from the first potential level, to the variable voltage potential node when actuating the first and second switches to store a photodiode integration voltage from the floating diffusion node in the capacitor of said first assembly.

12. The pixel of claim 11, wherein the first switch couples the first transistor to the internal node.

13. The pixel of claim 11, wherein the first switch couples the first transistor to the first node.

14. The pixel of claim 11, further comprising:
    a photoconversion area formed by a photodiode; and
    a transfer gate connected between the floating diffusion node and said photoconversion area.

15. The pixel of claim 14, wherein the transfer gate is actuated to transfer the photodiode integration voltage to the floating diffusion node.

16. The pixel of claim 11, further comprising:
    a third transistor connected between the floating diffusion node and a supply node;
    wherein the third transistor is actuated to transfer the initialization voltage from said supply node to the floating diffusion node.

17. The pixel of claim 11, wherein the first potential level is lower than the second potential level.

18. The pixel of claim 11, wherein the control circuit is configured to switch from the first potential level to the second potential level while controlling a slope of change in potential at the variable voltage potential node.

19. A pixel, comprising:
    a variable voltage potential node;
    a floating diffusion node;
    a first transistor and a first switch series-connected between the variable voltage potential node and an internal node of the pixel, a control terminal of the first transistor being coupled to the floating diffusion node;
    a plurality of assemblies, each assembly comprising a capacitor series-connected with a second switch between the internal node and a reference node;
    a second transistor having a control terminal connected to the internal node and having a first conduction terminal coupled to an output node of the pixel; and
    a control circuit configured, during each operation to store a voltage representative of a state of the floating diffusion node in an assembly of said plurality of assemblies, to successively:
    turn on the second switch of said assembly and turn on the first switch;
    switch a control potential at the variable voltage potential node from a first level to a second level; and control turning off of the second switch of said assembly to store said voltage across the capacitor of said assembly;

wherein a same time period separates, during each operation to store, the switching from the first level to the second level of the control potential and the turning off of the second switch of said assembly.

20. The pixel of claim 19, wherein the first switch couples the first transistor to the internal node.

21. The pixel of claim 19, wherein the first switch couples the first transistor to the first node.

22. The pixel of claim 19, further comprising:
a photoconversion area formed by a photodiode; and
a transfer gate connected between the floating diffusion node and said photoconversion area.

23. The pixel of claim 19, further comprising:
a third transistor connected between the floating diffusion node and a supply node;
wherein the third transistor is actuated to transfer a reset voltage from said supply node to the floating diffusion node.

24. The pixel of claim 19, wherein the first level is lower than the second level.

25. The pixel of claim 19, wherein the control circuit is configured to switch from the first level to the second level while controlling a slope of change of the control potential.

* * * * *